United States Patent [19]

Tabei et al.

[11] 4,231,808
[45] Nov. 4, 1980

[54] THIN FILM PHOTOVOLTAIC CELL AND A METHOD OF MANUFACTURING THE SAME

[75] Inventors: Masatoshi Tabei; Kazuhiro Kawaziri; Yosuke Nakajima, all of Asaka, Japan

[73] Assignee: Fuji Photo Film Co., Ltd., Minami-ashigara, Japan

[21] Appl. No.: 72,817

[22] Filed: Sep. 5, 1979

[30] Foreign Application Priority Data

Sep. 5, 1978 [JP] Japan .................................. 53-108958

[51] Int. Cl.³ ............................................ H01L 31/04
[52] U.S. Cl. .................................... 136/260; 136/258; 204/192 S; 204/192 P; 357/30; 427/76
[58] Field of Search ...................... 136/89 CD, 89 TF; 204/192 S, 192 P; 357/30; 427/76

[56] References Cited

U.S. PATENT DOCUMENTS

| | | | |
|---|---|---|---|
| 3,531,335 | 9/1970 | Heyerdahl et al. | 148/174 |
| 3,982,260 | 9/1976 | Wald | 357/15 |
| 4,035,197 | 7/1977 | Raychaudhuri | 136/89 CD |

OTHER PUBLICATIONS

D. A. Cusano, "CdTe Solar Cells & Photovoltaic Heterojunctions in II–VI Compounds," *Solid-State Electronics*, vol. 6, pp. 217–232 (1963).

R. O. Bell et al., "A New Look at CdTe Solar Cells," *Conf. Record, 11th IEEE Photovoltaic Specialists Conf.*, (1975), pp. 497–502.

J. Bernard et al., "CdTe Thin Film Solar Cells," Proc. Int'l Photovoltaic Solar Energy Conf., Luxembourg, 1977, Reidel Pub. Co., pp. 1293–1301.

J. Mimila-Arroyo, "Electric & Photovoltaic Properties of CdTe pn Homojunctions," *Solar Energy Materials*, vol. 1, pp. 171–180 (1979).

*Primary Examiner*—Aaron Weisstuch
*Attorney, Agent, or Firm*—Sughrue, Rothwell, Mion, Zinn and Macpeak

[57] ABSTRACT

An improved type of thin film photovoltaic cell can be produced by forming a thin layer of n-type CdTe up to 2 micron thick on a conductive support, heat-treating the CdTe layer at 80° to 210° C. for 20 to 180 minutes, and providing on the free surface of the heat-treated CdTe layer a transparent electrode.

17 Claims, 1 Drawing Figure

U.S. Patent
Nov. 4, 1980
4,231,808
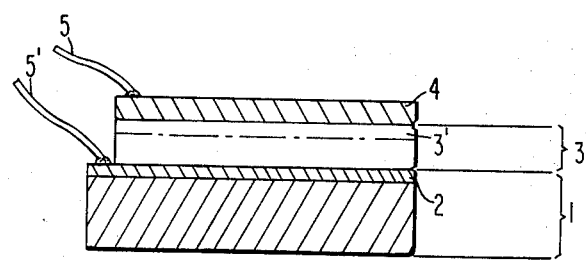

THIN FILM PHOTOVOLTAIC CELL AND A METHOD OF MANUFACTURING THE SAME

BACKGROUND OF THE INVENTION

1. Field of the Invention

This invention relates to thin film photovoltaic cells and a method of producing the same, in particular, to cells comprising a CdTe thin coating.

2. Description of the Prior Art

Photovoltaic cells, such as solar cells, convert radiation such as sunlight directly into electric energy. A majority of solar cells nowadays use silicon single crystals. Since the preparation of silicon single crystals requires enormous cost and time, solar cells based on this material are now in use only in specific applications including a lighthouse energy source. Besides, this material operates by an indirect transition mechanism with an essentially low absorption coefficient, thus demanding a relatively large crystal thickness of about 100 microns. Hence, the lower limit of production cost is comparatively high.

In contrast, the use of III–V or II–VI compound semiconductor materials permits a remarkable reduction in the necessary thickness of the photoreceptor by a factor of several tenths or less, thanks to their high absorption coefficients due to their operational mode based on direct transition. A III–V compound semiconductor material is a material consisting of elements of Group III and V of the Periodic Table of Elements such as GaAs. Similarly a II–VI material is one consisting of elements of Group II and VI of the Periodic Table. Moreover, one can produce an energy converter of a polycrystalline morphology enabling further reduction of production costs as well as production time compared to the case of silicon single crystal cells. Among these materials, II–VI compound semiconductors are particularly attractive mainly because of their inexpensive raw materials. Among II–VI semiconductors, CdTe theoretically has the highest efficiency for converting radiation into electric energy.

Homogeneous junction type photovoltaic cells based on CdTe are known which comprise a sintered CdS coating as a transparent electrode, an n-type CdTe layer formed on the CdS coating by means of screen printing, and a p-type surface layer formed on the surface of the n-type CdTe by thermally diffusing p-type impurities in the n-type CdTe. Unfortunately, however, due to the difficulty in uniformly forming a thin p-type layer with a high impurity content, no one has ever succeeded in achieving a sufficiently high conversion efficiency. Besides, the thickness of the CdTe coating prepared by the described method is about 10 microns, which is more than five times thicker than that theoretically required. Since CdTe is a direct transition type semiconductor, the light absorption coefficients $\alpha$ for photons having energies ($\hbar\omega$) exceeding the band gap energy (Eg) increase in proportion to $\sqrt{\hbar\omega}$. Accordingly, radiations with energies above Eg are completely absorbed by a CdTe layer having a thickness of 2 microns. Thus, thicknesses larger than this value are unnecessary for absorption efficiency. However, far greater difficulties are encountered for such a thin coating of CdTe with a thickness of about 2 microns in the production of a shallow p-n junction with a sufficient degree of uniformity.

On the other hand, Schottky barrier type photovoltaic cells employing a CdTe semiconductor have also been studied. For example, Japanese Patent Application (OPI) No. 119882/1977 (The term "OPI" as used herein refers to a "published unexamined Japanese patent application") or U.S. Pat. No. 4,035,197 discloses photovoltaic cells produced by preheating a CdTe polycrystalline coating in an oxygen-containing atmosphere at a temperature ranging from 250° to 500° C. for 1 to 20 minutes followed by coating a thin barrier forming metal such as gold thereon.

According to the description in the examples of these patents, the CdTe layer was prepared by slicing a hot-pressed product, and one may reasonably conclude this layer has a thickness of about several tens of microns, although definite data is lacking from the disclosures. Thus, they too have unnecessarily large thicknesses in comparison to the theoretical value cited above.

The specifications further point out a desirable effect of the preheating is to improve the open-circuit voltage of the resulting cell. It should be noted that such an effect is only valid for thick hot-pressed products of CdTe. It is unpredictable whether such preheating operation is also effective for CdTe thin layers of 2 microns or less thickness. Actually, when a Schottky barrier type photovoltaic cell comprising a thin CdTe layer provided with a gold barrier was subjected to heat-treatment above 250° C., the open-circuit voltage was experimentally confirmed to be reduced almost to zero as will be shown in the examples later.

Generally speaking, when the thickness of a CdTe layer is reduced to about that theoretically required, the resulting photovoltaic cell proved to exhibit a far poorer performance, in particular, as for open-circuit voltage in comparison to those utilizing hot-pressed products of CdTe.

SUMMARY OF THE INVENTION

Therefore, an object of the present invention is to provide a method of improving the performance, particularly the open-circuit voltage, of photovoltaic cells employing a CdTe thin layer.

Another object of the present invention is to provide a manufacturing method for CdTe thin layer photovoltaic cells comprising a CdTe thin layer involving a shallow p-n homogeneous junction therein.

Still another object of the present invention is to provide preferable heat-treating conditions for CdTe layers with thicknesses not exceeding 2 microns.

A further object of the present invention is to provide a thin film solar cell having an n-type CdTe layer up to 2 microns thick.

BRIEF DESCRIPTION OF THE FIGURE

The FIGURE is a cross-section of a thin film solar cell in accordance with the present invention.

DETAILED DESCRIPTION OF THE INVENTION

The manufacturing method for CdTe thin film photovoltaic cells of the present invention may be characterized by provision of an n-type CdTe thin layer of from about 0.8 to 2 micron thickness on the conductive surface of a substrate, heat-treatment of said n-type CdTe thin layer at a temperature between 80° C. and 120° C. for a period between 20 and 180 minutes, and provision of a transparent output electrode on the surface of the heat-treated layer opposite the contiguous conductive support surface.

Now, the manufacture of a thin film photovoltaic cell in accordance with the present invention will be explained in detail with reference to the accompanying drawing. In the FIGURE, a cross-sectional view of a cell of the present invention is depicted which comprises a substrate 1, a conductive surface 2, a CdTe thin layer 3, a modified region 3' of the CdTe layer and output electrode 4.

The first step of the instant manufacturing method is to form thin layer 3 comprising a n-type CdTe on the surface 2 of substrate 1. Suitable structures for substrate 1 include an electrically insulating or poorly conductive base member such as plastic films, glass plates, etc., provided on one surface thereof with a conductive coating, and an electrically conductive base member such as a metal plate, foil, etc. Insulating or poorly conductive base members such as plastics or glass can be made electrically conductive at their surface by laminating a thin metal foil thereto, or providing a thin metallic coating thereon comprising, for example, Au, Pt, Ag, In, Al, Ni, Fe-Ni alloy, In-Ga alloy, stainless steel, etc., by means of vacuum deposition, sputtering, ion plating, electroless plating, etc. Indirect processes may also be adopted such as oxidation of a deposited coating of In or SN to give rise to a conductive coating comprising $In_2O_3$ or $SnO_2$.

Alternatively, a water-soluble salt of In or Sn may be spread over the substrate surface in the form of an aqueous solution. After the evaporation of solvent, the substrate is heated to convert the salt into $In_2O_3$ or $SnO_2$. The thickness of the conductive coating thus prepared can range from about 0.01 to 1.0 micron, which is suitable to act as one electrode of a photovoltaic cell but should not be regarded as restrictive or critical.

In the practice of the present invention, an n-type CdTe thin coating 3 must be formed on conductive surface 2 of the above-described substrate 1. Various procedures for forming a thin coating which are applicable to the present purpose (such as vacuum deposition, D.C. sputtering, high frequency (R.F.) sputtering, ion plating, flash vacuum deposition, chemical vapor deposition, etc.) are described in, for example, *Modern Science Series, Kinzoku no Usumaku (Thin Metallic Film)* by Kise Leaver, translated by Kunio Hirata, Kyoritsu Publishing Co., Tokyo (1975), and *Handbook of Thin Film Technology*, edited by L. I. Maissel and R. Glang, McGraw-Hill Book Co., N.Y. (1970), etc.

CdTe is made n-type with the addition of suitable impurities such as Cl, Br, I, In, Al, Ga or Cd, which may be incorporated in CdTe prior to film formation, deposited on surface 2 of substrate 1 simultaneously with the formation of CdTe film, or doped by diffusion or annealing subsequent to the formation of CdTe thin film. The above-mentioned impurity is contained at a concentration level high enough to make CdTe an n-type photoconductor (up to about $10^{-4}$ mol/mol CdTe), though, of course, the concentration range does not limit the scope of the present invention. In one of the most preferred embodiments of the present invention, an n-type CdTe thin film 3 can be formed by simultaneous sputtering of CdTe with Cd as an impurity in which a suitable amount of Cd placed close to or on the CdTe sputtering target is subjected to high frequency (R.F.) sputtering.

As has been pointed out previously, the thickness of the n-type CdTe thin film 3 need not exceed 2 microns as regards the light absorption efficiency. On the other hand, to ensure sufficient smoothness or uniformity of the film structure as well as the degree of surface modification to be achieved at the subsequent heat-treatment, a thickness not less than about 0.8 micron is preferred. Hence, the n-type CdTe thin film used in the present invention is desirably prepared to have a thickness of from about 0.8 to 2 microns. A preferable range is from about 1 to 1.8 microns and a more preferable from about 1.1 to 1.7 microns.

One can improve both of the open- and short-circuit voltage of the CdTe photovoltaic cell by heating the thus prepared n-type CdTe film at a temperature between about 80° and 210° C. for about 20 to 180 minutes. The heat-treatment duration required varies reciprocally with an increase in the temperature. Thus for a higher heating temperature, the heating may be terminated in a shorter period within the cited range, and vice versa. When the heating temperature exceeds 210° C., the open- and short-circuit voltage is reduced for any practical range of heating duration, while below 80° C. the extent of improvement in the open- and short-circuit current is insufficient. In conclusion, an improvement of the open- and short-circuit voltage as well as the corresponding current values can be realized only for the ranges of heating temperature and duration claimed in the present invention for the n-type CdTe thin film with a thickness between 0.8 and 2 microns. Within these ranges the optimum heat-treatment conditions can be selected depending on the thickness of the n-type CdTe film. Particularly preferred results can be attained at a temperature between 100° and 150° C. and a duration of from 20 to 180 minutes relatively independently of the thickness of CdTe film.

The described heat-treatment is carried out with the surface of n-type CdTe thin layer 3 opposite the one facing the substrate kept open or free. It has been proved that the atmosphere to which this free surface of the CdTe thin layer is exposed during such heat-treatment does not critically influence the results of the present invention. Thus, the heat-treatment can be performed under any atmospheric conditions with oxidizing, reducing or gaseous phases provided that the phase should not contain impurities capable of making the CdTe n-type conductive.

A number of heating means well-known in the technical art can be used for heat-treatment including, for example, hot plate, heating drum, high frequency heating device, infrared heater, various types of furnace, etc. A very simple way of heat-treatment is to place the n-type CdTe film bearing member on a hot plate maintained at a predetermined temperature for a predetermined period with the substrate side down. After the heat-treatment has completed, the member is left in ambient air to cool to room temperature when it is subjected to a subsequent procedure.

The mechanism by which such a heat-treatment can raise the open-circuit voltage alone or in some cases along with the short-circuit current of the resulting CdTe thin film photovoltaic cell is not clear as yet. However, the fact that CdTe thin films heat-treated under more severe conditions than those claimed in the present invention as to temperature and/or duration exhibit p-type conduction apart from their original n-type conduction strongly suggests that heat-treatment causes a gradual conversion of the n-type CdTe to the p-type initiating at its free surface.

Postulating this mechanism, one can attribute the preferred effect (improvement of open-circuit voltage with or without improvement of short-circuit current)

caused by the heat-treatment characterizing the present invention to the formation of a shallow p-n junction within the small thickness of 0.8 to 2 microns of the n-type CdTe layer. On the contrary, heat-treatment at higher temperatures outside the upper limit defined in the present invention, which caused deterioration of photovoltaic cell performance, probably converted the entire thickness of the originally n-type CdTe thin film to the p-type. Whether the above theory is correct or not, a uniform modified region 3' is formed from the free surface of the n-type CdTe thin layer 3 to a certain depth by heat-treatment.

The CdTe thin film photovoltaic cell of the present invention is completed by providing output electrode 4 on the surface of modified region 3' of the heat-treated CdTe thin film 3. Output electrode 4 comprises conductive metals such as Au, Ni, Pd, Ag, Cu, Pt, Cr, Al, etc., or conductive metal compounds such as $SnO_2$. In a preferred embodiment of the present invention, light impinges through output electrode 4 which is constructed to be optically transparent. One example of such a light-transmitting electrode is a mesh electrode comprising one of the above-cited metals and is provided on the surface of modified region 3' by the use of an optical mask or by other conventionally known methods. More preferably, the whole or major area of the surface of modified region 3' is covered by a thin layer comprising one of the metals or the metal compounds cited above and capable of transmitting a substantial portion of impinging light. Formation of such a metal coating can be performed by vacuum deposition, CVD process, electrochemical deposition, electroless plating, and the like. In the case where the thin film comprising a metal or a metal compound or the mesh electrode has a sufficient electric conductivity, an electric wire lead can be bonded directly onto each of these coatings. Electric energy can then flow by the completion of an electric circuit between another lead 5' bonded to conductive substrate 1 or the conductive coating 2 provided on the substrate. Some metal coatings, when quite thin enough to transmit light, exhibit a poor lateral conductivity, in particular, for a cell structure covering a rather large area. In such cases, it is desirable to superimpose another mesh electrode in ohmic contact with the transparent metal (or metal compound) coating whereby wire lead 5 is bonded to the mesh electrode to complete an electric circuit with lead 5'.

As another preferred embodiment of the present invention, an anti-reflection coating can be formed on output electrode 4. A photo-receptive surface provided with an anti-reflection coating exhibits an improved absorption efficiency for impinging light. Such an anti-reflection coating usually comprises $SnO_x$ ($x \leq 2$), ZnO or zirconium oxide, each of which is coated to have a thickness equal to about one quarter the wavelength of the light to be absorbed. Methods of forming such anti-reflection coatings are disclosed in, for example, U.S. Pat. Nos. 3,888,697, 3,703,408, 3,769,558 and 3,811,954, etc., from which one may select a revelant one.

To recapitulate, the present invention has illuminated the drop of the open-circuit voltage which normally occurs at reduced thicknesses of the CdTe layer within the theoretically predicted range. And surprisingly, the present invention has even succeeded in, in certain cases, improving the short-circuit current level by an industrially applicable, rather simple procedure.

The following examples will provide an even better understanding of the present invention.

EXAMPLES 1 TO 14

A piece of Vicole glass 1.25 cm long, 2.5 cm wide and about 1 mm thick in rectangular form and bearing an $In_2O_3$ coating on one surface thereof with a surface resistance of 100 $\Omega/cm^2$ was mounted on a support holder of an RF sputtering apparatus ("SPF 332" manufactured by NEVA Co.) in such a manner that the $In_2O_3$ coated side faced the target, and a 1.0 mm wide mask was attached to the $In_2O_3$ coating along one of the shorter side edges. A CdTe target (commercially available from MCR Co.) of 80 mm diameter was charged in the target holder around which were placed ten pieces of Cd metal shot of four nines grade. Each piece weighed 0.5 g. Then, keeping the inside of the apparatus at 20 mm Torr of Argon, and maintaining the temperature of the substrate at 300° C., RF sputtering was performed with 100 w electric power to form an n-type CdTe thin film of about 1.1 microns thick over the area of about 1.15 cm×2.5 cm of the $In_2O_3$ coating.

The sample thus-prepared was then subjected to heat-treatment, the conditions of which are listed in Table 1. The heat-treatment was carried out by placing the sample on a heated flat plate kept at a predetermined temperature for a predetermined period in air with the substrate side opposite to the CdTe film in contact with the plate. The heater employed was a "Heat Plate, Model 162" available from Techni. Lab. Instrument Co.

After each sample was left in the ambient atmosphere until it equilibrated therewith, a gold layer of about 60 Å thickness was superimposed by vacuum deposited over the area of 1 cm×2 cm of the CdTe thin film. Finally, a gold lead was bonded with asilver paste (Silver Paste 4929, a product of Du Pont de Nemours Co.) to each of the exposed portion of the $In_2O_3$ coating (which had been masked during the sputtering of CdTe) and the outermost gold coating.

Each of the photovoltaic cells thus finished was subjected to measurements of open-circuit voltage ($V_{oc}$) and short-circuit current ($I_{sc}$) generated between the two gold leads under light irradiation from the gold electrode side with about 10 mW/$cm^2$ intensity by use of a reflector flood lamp for color photography (PRF, 100 V, 500 W, available from AI Lamp, Inc.). The results are shown in Table 1.

TABLE 1

| Sample No. | Heating Temperature (°C.) | Heating Time (min) | $V_{oc}$ (mV) | $I_{sc}$ (mA) |
|---|---|---|---|---|
| 1* | — | — | 320 | 1.1 |
| 2 | 83 | 180 | 355 | 1.9 |
| 3 | 100 | 150 | 380 | 1.9 |
| 4 | 135 | 120 | 450 | 2.7 |
| 5 | 155 | 120 | 355 | 2.1 |
| 6 | 225 | 30 | −20 | −0.02 |
| 7 | 240 | 20 | −27 | −0.05 |
| 8 | 255 | 13 | −30 | −0.04 |
| 9 | 280 | 10 | −36 | −0.07 |
| 10 | 290 | 9 | −28 | −0.04 |
| 11 | 300 | 8 | −13 | −0.01 |
| 12 | 325 | 5.5 | 0 | 0 |
| 13 | 350 | 4 | −9 | −0.1 |
| 14 | 365 | 2.5 | 2 | −0.01 |

This data clearly demonstrates remarkable increases of $V_{oc}$ as well as $I_{sc}$ by heat-treatment within the range claimed in the present invention, and also shows that heat-treatments at a temperature above 225° C. rather deteriorate these two values.

EXAMPLES 15 to 19

The procedures described in the foregoing examples were repeated except that the thickness of the n-type CdTe film was increased to 1.7 microns by changing the sputtering time, and the heat-treatment conditions shown in Table 2 were adopted. Photovoltaic cells 15 to 19 thus finished were subjected to the same measurements of $V_{oc}$ and $I_{sc}$. The results are shown in Table 2.

TABLE 2

| Sample No. | Heating Temperature (°C.) | Heating Time (min) | $V_{oc}$ (mV) | $I_{sc}$ (mA) |
|---|---|---|---|---|
| 15* | — | — | 290 | 2 |
| 16 | 83 | 180 | 450 | 1.8 |
| 17 | 140 | 120 | 500 | 0.8 |
| 18 | 160 | 60 | 480 | 0.5 |
| 19 | 205 | 20 | 450 | 0.6 |

*Same as in Table 1.

While the invention has been described in detail and with reference to specific embodiments thereof, it will be apparent to one skilled in the art that various changes and modifications can be made therein without departing from the spirit and scope thereof.

What is claimed is:

1. A method of manufacturing a photovoltaic cell which comprises providing a thin coating of n-type CdTe of up to about 2 microns thick on a conductive surface of a substrate, heat-treating said CdTe thin coating at a temperature of from about 80° to 210° C. for a period of from 20 to 180 minutes to form a modified surface region of said CdTe coating, and providing a transparent output electrode on the surface of said heat-treated thin coating opposite the substrate.

2. The method of claim 1, wherein said CdTe layer is about 0.8 to 2.0 microns thick.

3. The method of claim 1, wherein said CdTe layer is about 1.0 to 1.8 microns thick.

4. The method of claim 1, wherein said heat-treating is at 100° to 150° C.

5. The method of claim 1, wherein said CdTe layer is provided by simultaneously sputtering a CdTe target and Cd shot.

6. A thin film photovoltaic cell comprising a conductive support, an overlying n-type CdTe layer having a thickness of up to about 2 microns which has been heat-treated at about 80° to 210° C. for about 20 to 180 minutes and a transparent electrode on the surface of said heat treated CdTe layer opposite said support.

7. The cell of claim 6, wherein said support is a glass plate or plastic film having a conductive coating thereon.

8. The cell of claim 6, wherein said support is a metal plate or foil.

9. The cell of claim 7, wherein said conductive coating is a coating containing Au, In, Al, Ni, Fe-Ni, Pt, Ag, In-Ga, or stainless steel.

10. The cell of claim 7, wherein said conductive coating is $In_2O_3$ or $SnO_2$.

11. The cell of claim 6, wherein said CdTe layer is 0.8 to 2 microns thick.

12. The cell of claim 6, wherein said CdTe layer is about 1.0 to 1.8 microns thick.

13. The cell of claim 6, wherein said CdTe layer is heat treated at about 100° to 150° C.

14. The cell of claim 6, wherein said transparent electrode is Au, Ni, Pd, Ag, Cu, Pt, Cr, Al, or a conductive metal compound.

15. The cell of claim 6, wherein said transparent electrode is a mesh electrode.

16. The cell of claim 6, wherein said transparent electrode is a thin uniform layer of a metal or a metal compound.

17. The cell of claim 6, wherein said transparent electrode is a thin uniform layer of a metal or a metal compound and a mesh electrode.

* * * * *